(12) United States Patent
Wang et al.

(10) Patent No.: US 11,286,969 B2
(45) Date of Patent: Mar. 29, 2022

(54) FASTENING STRUCTURE

(71) Applicant: FIVETECH TECHNOLOGY INC., New Taipei (TW)

(72) Inventors: Ting-Jui Wang, New Taipei (TW); Hsien-Chang Chen, New Taipei (TW)

(73) Assignee: FIVETECH TECHNOLOGY INC., New Taipei (TW)

( * ) Notice: Subject to any disclaimer, the term of this patent is extended or adjusted under 35 U.S.C. 154(b) by 502 days.

(21) Appl. No.: 16/233,382

(22) Filed: Dec. 27, 2018

(65) Prior Publication Data
US 2019/0203749 A1 Jul. 4, 2019

(30) Foreign Application Priority Data
Dec. 29, 2017 (TW) ................... 106146656

(51) Int. Cl.
*F16B 2/14* (2006.01)
*H05K 5/02* (2006.01)
(52) U.S. Cl.
CPC .............. *F16B 2/14* (2013.01); *H05K 5/0221* (2013.01); *Y10T 403/591* (2015.01)
(58) Field of Classification Search
CPC ...... F16B 1/04; F16B 2/04; F16B 2/12; F16B 2/14; H01R 12/7058; H05K 5/0221; H05K 7/1402; H05K 7/1405; H05K 7/1409; Y10T 403/591; Y10T 403/599; Y10T 403/60; Y10T 403/602; Y10T 403/604; Y10T 403/76
USPC ................... 403/322.1, 325, 326, 328, 409.1
See application file for complete search history.

(56) References Cited

U.S. PATENT DOCUMENTS

| 7,749,006 B2 * | 7/2010 | Chiang | H05K 7/1409 439/160 |
| 10,462,922 B2 * | 10/2019 | Moreau | H05K 7/1409 |
| 2015/0296649 A1 * | 10/2015 | Wang | H05K 7/1409 403/326 |
| 2017/0042054 A1 * | 2/2017 | Su | H05K 7/1409 |

FOREIGN PATENT DOCUMENTS

| CN | 104976191 A | 10/2015 |
| TW | 201538861 A | 10/2015 |

* cited by examiner

*Primary Examiner* — Josh Skroupa
(74) *Attorney, Agent, or Firm* — Schmeiser, Olsen & Watts, LLP (57) ABSTRACT

A fastening structure includes an operating engaging element and a body portion. The operating engaging element has an engaging portion and an operating portion. The operating portion has a moving surface abutting against a corresponding moving surface of the operating engaging element to cause movement of the operating engaging element. The body portion has a mounting portion which the operating engaging element is mounted on; or the operating engaging element has a mounting portion which the body portion is mounted. With the engaging portion, the operating engaging element is fastened to an object, and the body portion is fastened to another object, thereby fastening the two objects together. Unfastening the two objects entails pressing the operating portion such that the moving surface of the operating portion abuts against the corresponding moving surface of the operating engaging element to cause movement of the operating engaging element, thereby separating the objects.

8 Claims, 10 Drawing Sheets

FASTENING STRUCTURE

CROSS-REFERENCE TO RELATED APPLICATION

This non-provisional application claims priority under 35 U.S.C. § 119(a) on Patent Application No(s). 106146656 filed in Taiwan, R.O.C. on Dec. 29, 2017, the entire contents of which are hereby incorporated by reference.

FIELD OF THE INVENTION

The present disclosure relates to fastening structures and, more particularly, to a fastening structure capable of fastening and separating at least two objects repeatedly and quickly.

BACKGROUND OF THE INVENTION

A conventional means of coupling two objects together involves fixing the two objects to each other with screws to ensure firm connection of the two objects and render the two objects inseparable.

However, the aforesaid conventional means has drawbacks as follows: it lacks ease of use; and the two objects are difficult to demount because of the screws.

Therefore, it is imperative to provide a fastening structure capable of fastening and separating at least two objects repeatedly and quickly.

SUMMARY OF THE INVENTION

In view of the aforesaid drawbacks of the prior art, it is an objective of the present disclosure to provide a fastening structure capable of fastening and separating at least two objects repeatedly and quickly.

In order to achieve the above and other objectives, the present disclosure provides a fastening structure, comprising: an operating engaging element and a body portion; the operating engaging element has an engaging portion and an operating portion, the operating portion having a moving surface, the moving surface abutting against a corresponding moving surface of the operating engaging element to cause the operating engaging element to undergo displacement; and the body portion has a mounting portion which the operating engaging element is mounted on, or the operating engaging element having a mounting portion which the body portion is mounted on.

Regarding the fastening structure, a first moving space is disposed between the operating portion and the body portion.

Regarding the fastening structure, a second moving space is disposed between the operating engaging element and the operating portion.

The fastening structure further comprises a first resilient component with an end abutting against the body portion and another end abutting against the operating engaging element or the operating portion.

The fastening structure further comprises a second resilient component with an end abutting against the operating portion and another end abutting against the operating engaging element or the body portion.

Regarding the fastening structure, the operating portion has a stop portion, and the stop portion is stopped at the operating engaging element, the body portion or the operating portion.

Regarding the fastening structure, the operating engaging element or the body portion is configured to be connected by at least one connector.

Regarding the fastening structure, the body portion or the operating engaging element has at least one room which the connector, the body portion or the operating engaging element is configured to move within.

Regarding the fastening structure, the moving surface is an oblique surface, an arcuate surface, a curved surface, a spiral surface or a stepped surface.

Regarding the fastening structure, the corresponding moving surface is an oblique surface, an arcuate surface, a curved surface, a spiral surface or a stepped surface.

Regarding the fastening structure, the engaging portion is fastened to a first object.

Regarding the fastening structure, the body portion has a connecting portion, and the connecting portion is connected to a second object.

Regarding the fastening structure, the connecting portion is movably connected to a pivot, and the pivot is connected to the second object.

Regarding the fastening structure, the pivot has an axial portion, and the axial portion is movably coupled to the pivot.

Regarding the fastening structure, the pivot or the connecting portion has a resilient component with two ends abutting against the pivot and the body portion, respectively, or against the body portion and the second object, respectively, such that the body portion is confined in place or automatically rebounds under a resilient force of the resilient component.

Regarding the fastening structure, the body portion has a limiting portion, and the pivot has a corresponding limiting portion, such that the limiting portion and the corresponding limiting portion limit or stop each other when the body portion moves or rotates to a predetermined location.

Regarding the fastening structure, the body portion has a push portion for pushing and moving a third object.

Regarding the fastening structure, the push portion has a first push element or a second push element, allowing the first push element or the second push element to push, limit or open/close a third object.

Regarding the fastening structure, the third object has a pushed portion disposed between the first push element and the second push element to perform a push, limitation or opening/closing.

Regarding the fastening structure, the operating portion is pressed to cause the operating engaging element to undergo displacement, and the first resilient component abuts against the operating engaging element under a resilient force of the first resilient component as soon as the press on the operating portion ceases, thereby allowing the operating portion to return to the initial position.

Regarding the fastening structure, the operating portion is pressed to cause the operating engaging element to undergo displacement, and the second resilient component under a resilient force thereof allows the operating portion to return to the initial position as soon as the press on the operating portion ceases.

Regarding the fastening structure, the second object is a puller, a frame, a box or a casing.

Regarding the fastening structure, the puller has pulling portion for pulling a corresponding object.

Regarding the fastening structure, the second object has a fixed connection portion fixedly connected to the corresponding object.

Regarding the fastening structure, the connecting portion has a resilient component with two ends abutting against the body portion and the second object, respectively.

Regarding the fastening structure, the engaging portion is of a concave structure, a convex structure, a hook-shaped structure, a planar structure, a stepped structure, an arcuate structure or a curved structure.

Regarding the fastening structure, the body portion is movably coupled to, fixedly coupled to, or integrally formed with the second object.

Regarding the fastening structure, when the moving surface abuts against the corresponding moving surface, the operating engaging element is driven by the operating portion to move toward the body portion such that a receiving space of the mounting portion gradually diminishes because of movement of the operating engaging element.

Regarding the fastening structure, when the moving surface abuts against the corresponding moving surface, the operating portion moves toward the operating engaging element such that the first moving space gradually diminishes because of movement of the operating portion.

Regarding the fastening structure, when the moving surface abuts against the corresponding moving surface, the operating portion moves toward the operating engaging element such that the second moving space gradually diminishes because of movement of the operating portion.

Regarding the fastening structure, the mounting portion is a slot portion, a hole portion, a plane portion, a concave portion, a convex portion, a stepped structure portion, an oblique surface portion, a curved surface portion or a receiving space portion.

Regarding the fastening structure, the operating portion, the operating engaging element or the body portion has a movable portion movable by the stop portion.

Therefore, the fastening structure of the present disclosure is advantageous as follows: with the engaging portion, the operating engaging element is fastened to an object, and the body portion is fastened to another object, thereby fastening the two objects together; unfastening the two objects entails pressing the operating portion such that the moving surface of the operating portion abuts against the corresponding moving surface of the operating engaging element to cause movement of the operating engaging element, thereby separating the objects.

DETAILED DESCRIPTION OF THE PREFERRED EMBODIMENTS

Objectives, features, and advantages of the present disclosure are hereunder illustrated with specific embodiments, depicted with drawings, and described below.

Figure 1:
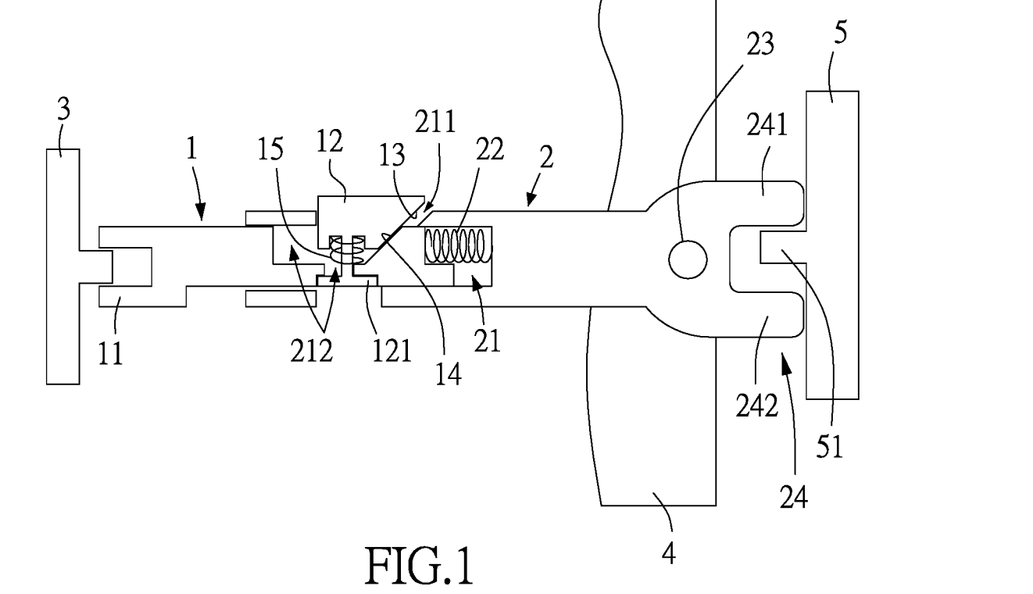
FIG. 1 is a schematic view of operation of a fastening structure according to the first preferred embodiment of the present disclosure.
Figure 2:
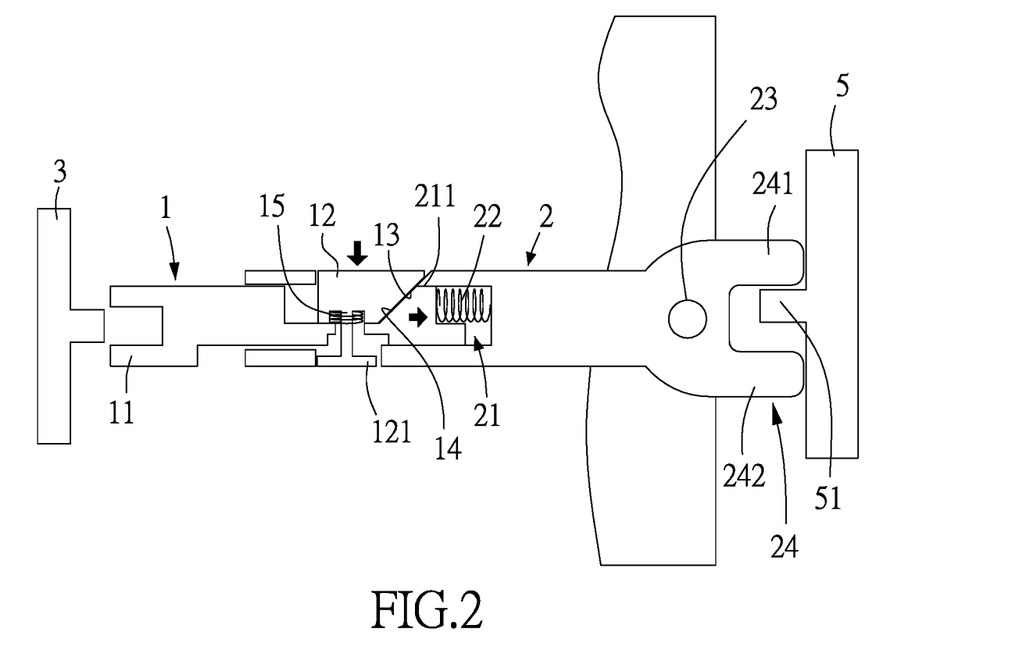
FIG. 2 is a schematic view of operation of a fastening structure according to the first preferred embodiment of the present disclosure.

Referring to FIG. 1 and FIG. 2, the present disclosure provides a fastening structure comprising an operating engaging element 1 and a body portion 2.

The operating engaging element 1 has an engaging portion 11 and an operating portion 12. The operating portion 12 has a moving surface 13. The moving surface 13 abuts against a corresponding moving surface 14 of the operating engaging element 1 to cause the operating engaging element 1 to undergo displacement.

The body portion 2 has a mounting portion 21 which the operating engaging element 1 is mounted on. The mounting portion 21 is a slot portion, a hole portion, a plane portion, a concave portion, a convex portion, a stepped structure portion, an oblique surface portion, a curved surface portion or a receiving space portion.

To operate the fastening structure of the present disclosure, the body portion 2 is connected to a second object 4, the engaging portion 11 of the operating engaging element 1 is fastened to a first object 3, and the body portion 2 is fastened to a third object 5, thereby fastening the first object 3 and the third object 5 together. To unfasten the first object 3 and the third object 5, the user presses the operating portion 12 such that the moving surface 13 of the operating portion 12 abuts against the corresponding moving surface 14 of the operating engaging element 1. When the moving surface 13 abuts against the corresponding moving surface 14, the operating engaging element 1 is driven by the operating portion 12 to move toward the body portion 2 such that a receiving space of the mounting portion 21 gradually diminishes because of movement of the operating engaging element 1; hence, the operating engaging element 1 partially moves to the mounting portion 21 and thus causes the operating engaging element 1 to undergo displacement, triggering the separation of the engaging portion 11 and the first object 3 and thus separating the first object 3 and the third object 5, so as to fasten and separate the first object 3 and the third object 5 repeatedly and quickly.

In an embodiment of the present disclosure, a first moving space 211 is disposed between the operating portion 12 and the body portion 2, and a second moving space 212 is disposed between the operating engaging element 1 and the operating portion 12. When the moving surface 13 abuts against the corresponding moving surface 14, the operating portion 12 moves toward the operating engaging element 1 such that the first moving space 211 gradually diminishes because of movement of the operating portion 12. When the moving surface 13 abuts against the corresponding moving surface 14, the operating portion 12 moves toward the operating engaging element 1 such that the second moving space 212 gradually diminishes (or enlarges) because of movement of the operating portion 12; hence, the first moving space 211 and the second moving space 212 serve as space for the movement/journey of the operating portion 12.

In an embodiment of the present disclosure, the fastening structure further comprises a first resilient component 22 and a second resilient component 15. The first resilient component 22 is disposed at the mounting portion 21. The first resilient component 22 has one end abutting against the body portion 2 and the other end abutting against the operating engaging element 1 (or the operating portion 12). The second resilient component 15 has one end abutting against the operating portion 12 and the other end abutting against the operating engaging element 1 (or the body portion 2). The user presses the operating portion 12 to cause the operating engaging element 1 to undergo displacement and compress the first resilient component 22. As soon as the user stops pressing the operating portion 12, the first resilient component 22 abuts, under a resilient restoring force thereof, against the operating engaging element 1 to cause the operating portion 12 to return to the initial position (height). Furthermore, when the operating portion 12 is pressed, the operating engaging element 1 undergoes displacement to thereby compress the second resilient component 15. As soon as the user stops pressing the operating portion 12, the second resilient component 15 causes the operating portion 12 to return to the initial position (height) under the resilient restoring force of the second resilient component 15.

In an embodiment of the present disclosure, the engaging portion 11 is of a concave structure, a convex structure, a hook-shaped structure, a planar structure, a stepped structure, an arcuate structure or a curved structure to thereby meet various needs for fastening objects together.

In an embodiment of the present disclosure, the operating portion 12 has a stop portion 121. The stop portion 121 is movably stopped at the operating engaging element 1 or the body portion 2 to prevent the separation of the operating portion 12 from the operating engaging element 1 or the body portion 2.

In an embodiment of the present disclosure, the moving surface 13 is an oblique surface, an arcuate surface or a curved surface, whereas the corresponding moving surface 14 is an oblique surface, an arcuate surface, a curved surface, a spiral surface or a stepped surface. Therefore, the moving surface 13 and the corresponding moving surface 14 can abut against each other as needed.

In an embodiment of the present disclosure, the body portion 2 has a connecting portion 23, and the connecting portion 23 is connected to a second object 4. The body portion 2 is movably coupled to or fixedly coupled to the second object 4 to thereby meet various needs for fastening objects together.

In an embodiment of the present disclosure, the body portion 2 has a push portion 24. The push portion 24 has a first push element 241 and a second push element 242. The third object 5 has a pushed portion 51. The first push element 241 of the push portion 24 and the second push element 242 together interact with the pushed portion 51 of the third object 5, thereby allowing the push portion 24 to push, limit or open/close the third object 5.

Figure 3:
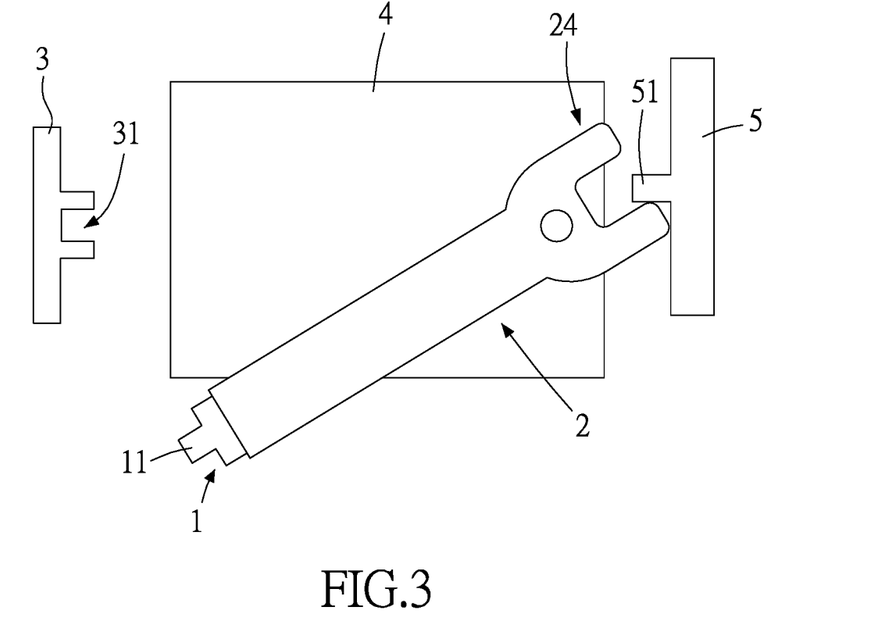
FIG. 3 is a schematic view of operation of the fastening structure according to the second preferred embodiment of the present disclosure.

Referring to FIG. 3, in this embodiment, the engaging portion 11 of the operating engaging element 1 is of a convex structure. To operate the fastening structure of the present disclosure, the user connects the connecting portion 23 of the body portion 2 to the second object 4, fastens the body portion 2 to a concave portion 31 of the first object 3 by the engaging portion 11 of the operating engaging element 1, and fastens the push portion 24 of the body portion 2 to the pushed portion 51 of the third object 5, so as to couple the first object 3 and the third object 5 together, thereby allowing the push portion 24 to push, limit or open/close the third object 5.

Figure 4:
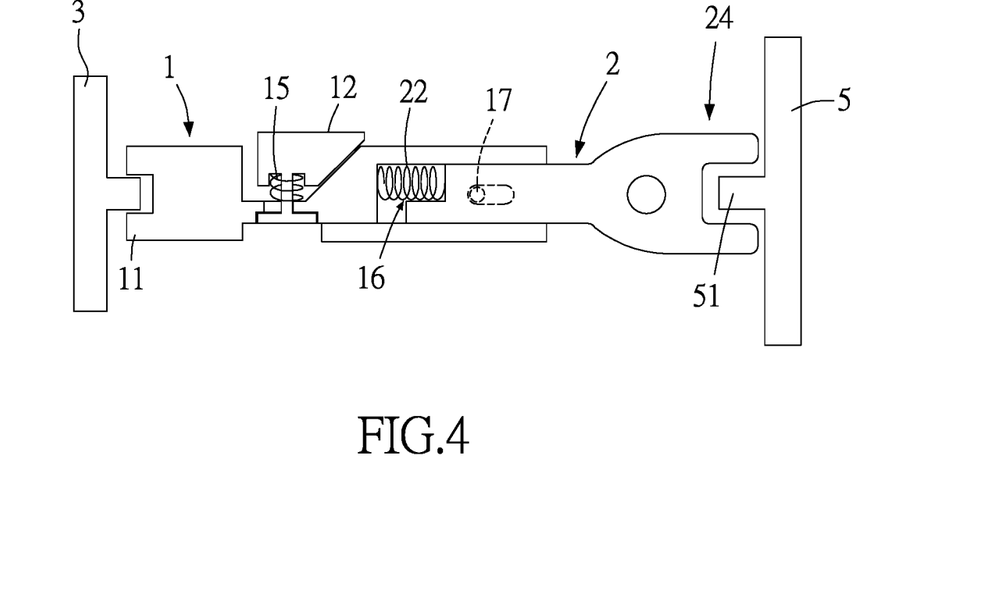
FIG. 4 is a schematic view of operation of the fastening structure according to the third preferred embodiment of the present disclosure.
Figure 5:
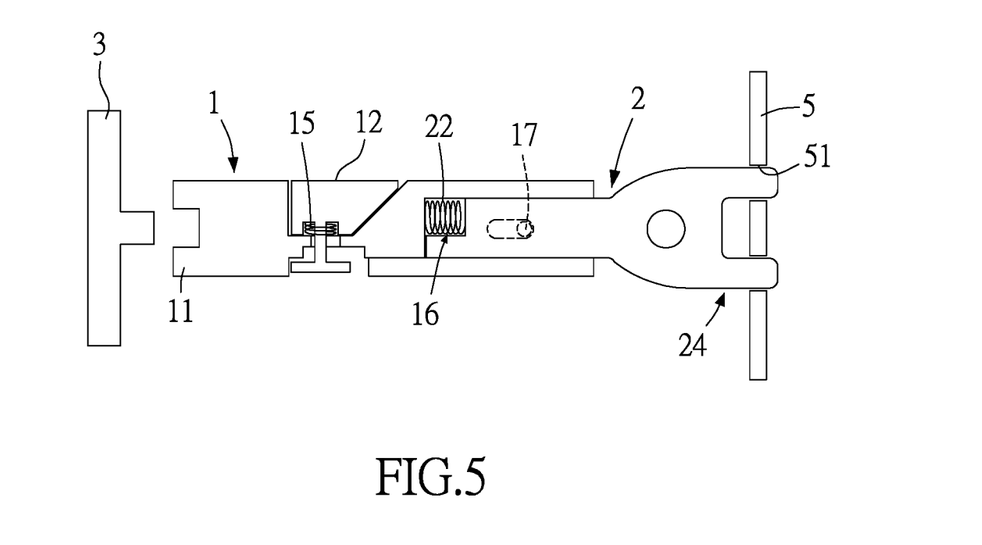
FIG. 5 is a schematic view of operation of the fastening structure according to the third preferred embodiment of the present disclosure.

Referring to FIG. 4 and FIG. 5, in this embodiment, the operating engaging element 1 has a mounting portion 16 which the body portion 2 is mounted on. The operating engaging element 1 and the body portion 2 are connected by at least one connector 17. The first resilient component 22 is mounted on the mounting portion 16. The first resilient component 22 has one end abutting against the body portion 2 and the other end abutting against the operating engaging element 1. The second resilient component 15 has one end abutting against the operating portion 12 and the other end abutting against the operating engaging element 1. The user presses the operating portion 12 to cause the operating engaging element 1 to undergo displacement and thus compress the first resilient component 22. As soon as the user stops pressing the operating portion 12, the first resilient component 22 abuts, under a resilient restoring force thereof, against the operating engaging element 1 such that the operating portion 12 returns to the initial position (height). Furthermore, when the operating portion 12 is pressed, the operating engaging element 1 undergoes displacement to thereby compress the second resilient component 15. As soon as the user stops pressing the operating portion 12, the second resilient component 15 allows the operating portion 12 to return to the initial position (height) under the resilient restoring force of the second resilient component 15.

Therefore, the user presses the operating portion 12 to cause the moving surface 13 of the operating portion 12 to abut against the corresponding moving surface 14 of the operating engaging element 1; hence, the operating engaging element 1 moves toward the body portion 2 in the presence of the mounting portion 16, whereas the body portion 2 partially moves to the mounting portion 16 and thus causes the operating engaging element 1 to undergo displacement such that the engaging portion 11 and the first object 3 are fastened together or separated, and the push portion 24 of the body portion 2 is fastened to the pushed portion 51 of the third object 5 to therefore couple the first object 3 and the third object 5 together. The pushed portion 51 is of a convex structure shown in FIG. 4 or is a through hole shown in FIG. 5, thereby allowing the push portion 24 to push, limit or open/close the third object 5.

Figure 6:
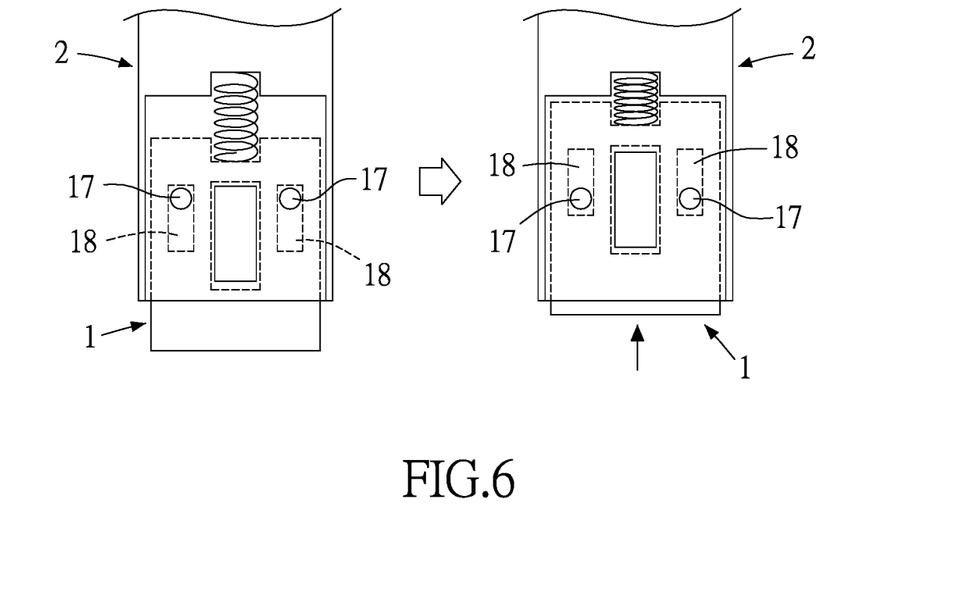
FIG. 6 is a schematic view of operation of the fastening structure according to the fourth preferred embodiment of the present disclosure.

Referring to FIG. 6, in this embodiment, the operating engaging element 1 and the body portion 2 are connected by at least one connector 17. The body portion 2 or the operating engaging element 1 has at least one room 18 which the connector 17, the body portion 2 or the operating engaging element 1 moves within.

Figure 7:
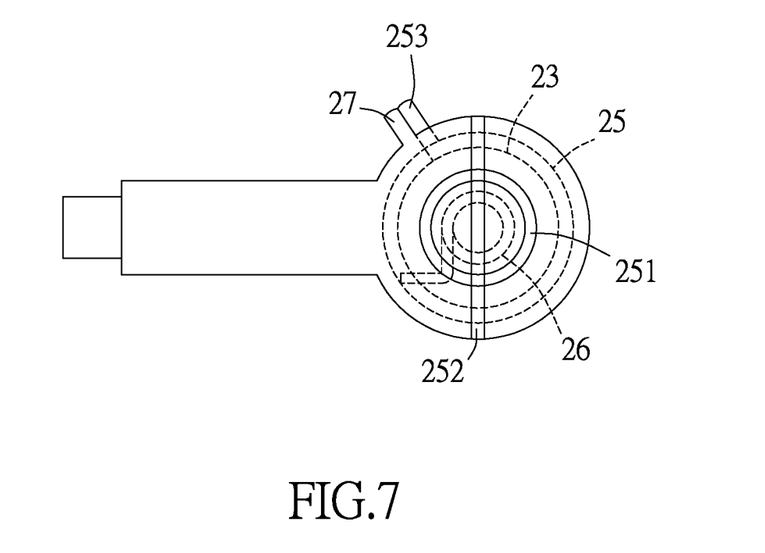
FIG. 7 is a schematic view of the fastening structure according to the fifth preferred embodiment of the present disclosure.

Referring to FIG. 7, in this embodiment, the body portion 2 has a connecting portion 23. The connecting portion 23 is movably connected to a pivot 25. The pivot 25 is connected to the second object. The pivot 25 has an axial portion 251. The pivot 25 and the axial portion 251 are connected by a latch portion 252. The axial portion 251 and the pivot 25 are movably fitted together. The pivot 25 or the connecting portion 23 has a resilient component 26. The resilient component 26 has two ends abutting against the pivot 25 and the body portion 2, respectively (alternatively, the resilient component 26 has two ends abutting against the body portion 2 and the second object, respectively) such that the body portion 2 is confined in place or automatically rebounds under a resilient force of the resilient component 26. The body portion 2 has a limiting portion 27. The pivot 25 has a corresponding limiting portion 253; hence, the limiting portion 27 and the corresponding limiting portion 253 limit or stop each other when the body portion 2 moves or rotates to a predetermined location.

Figure 8:
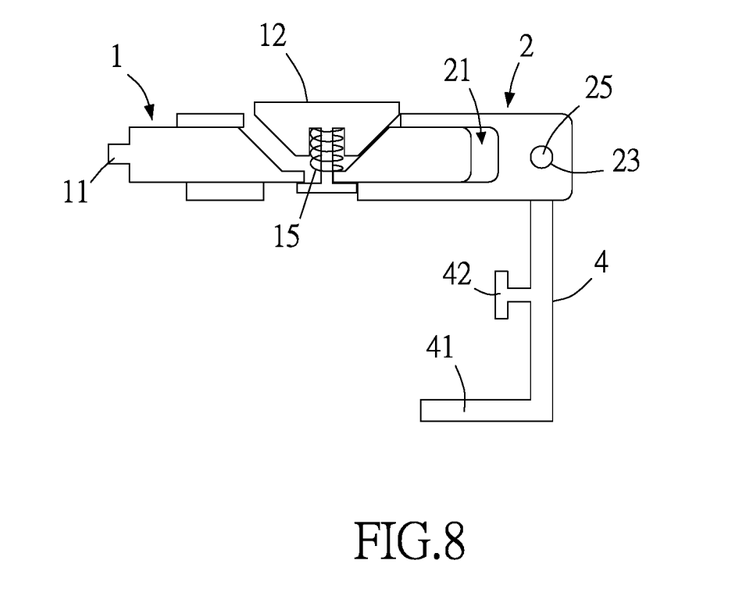
FIG. 8 is a schematic view of the fastening structure according to the sixth preferred embodiment of the present disclosure.

Referring to FIG. 8, in this embodiment, the second object 4 is a puller (or a box or a casing). The puller has a pulling portion 41. The pulling portion 41 pulls a corresponding object (not shown). The second object 4 has a fixed connection portion 42 fixedly connected to the corresponding object. The connecting portion 23 of the body portion 2 is movably coupled to the second object 4 by the pivot 25. The body portion 2 has a mounting portion 21 which the operating engaging element 1 is mounted on. The mounting portion 21 dispenses with the first resilient component; hence, the operating portion 12 is manipulated under the resilient restoring force of the second resilient component 15. In this embodiment, the engaging portion 11 of the operating engaging element 1 is of a convex structure (or a concave structure) to render the fastening structure of the present disclosure practical.

Figure 9:
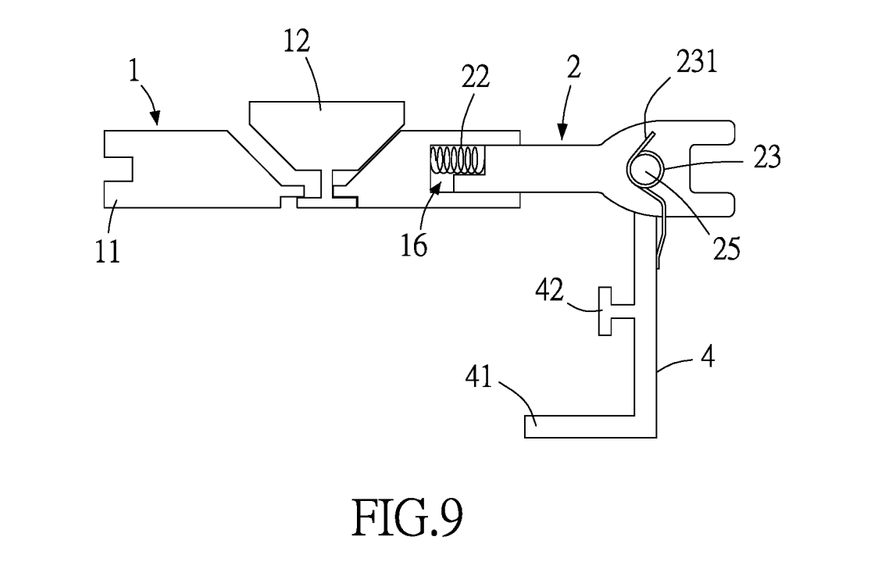
FIG. 9 is a schematic view of the fastening structure according to the seventh preferred embodiment of the present disclosure.

Referring to FIG. 9, in this embodiment, the second object 4 is a puller (or a box or a casing). The puller has a pulling portion 41. The pulling portion 41 pulls a corresponding object (not shown). The second object 4 has a fixed connection portion 42 fixedly connected to the corresponding object. The connecting portion 23 of the body portion 2 is movably coupled to the second object 4 by the pivot 25. The connecting portion 23 has a resilient component 231. The resilient component 231 has two ends abutting against the body portion 2 and the second object 4, respectively. The operating engaging element 1 has the mounting portion 16 which the body portion 2 is mounted on. The mounting portion 16 has therein the first resilient component 22. The operating portion 12 dispenses with the second resilient component, and thus the operating portion 12 is manipulated under the resilient restoring force of the first resilient component 22. In this embodiment, the engaging portion 11 of the operating engaging element 1 is of a concave structure (or a convex structure) to render the fastening structure of the present disclosure practical.

Figure 10:
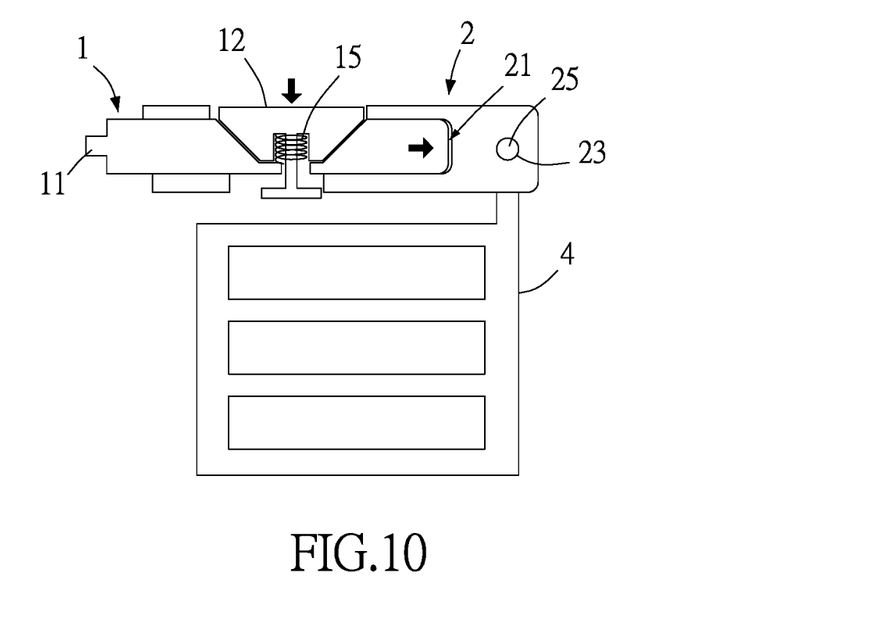
FIG. 10 is a schematic view of the fastening structure according to the eighth preferred embodiment of the present disclosure.

Referring to FIG. 10, in this embodiment, the second object 4 is a frame (or a box or a casing). The connecting portion 23 of the body portion 2 is movably coupled to the second object 4 by the pivot 25. The body portion 2 has the mounting portion 21 which the operating engaging element 1 is mounted on. The mounting portion 21 dispenses with the first resilient component, and thus the operating portion 12 is manipulated under a resilient restoring force of the second resilient component 15. In this embodiment, the engaging portion 11 of the operating engaging element 1 is of a convex structure (or a concave structure) to render the fastening structure of the present disclosure practical.

Figure 11:
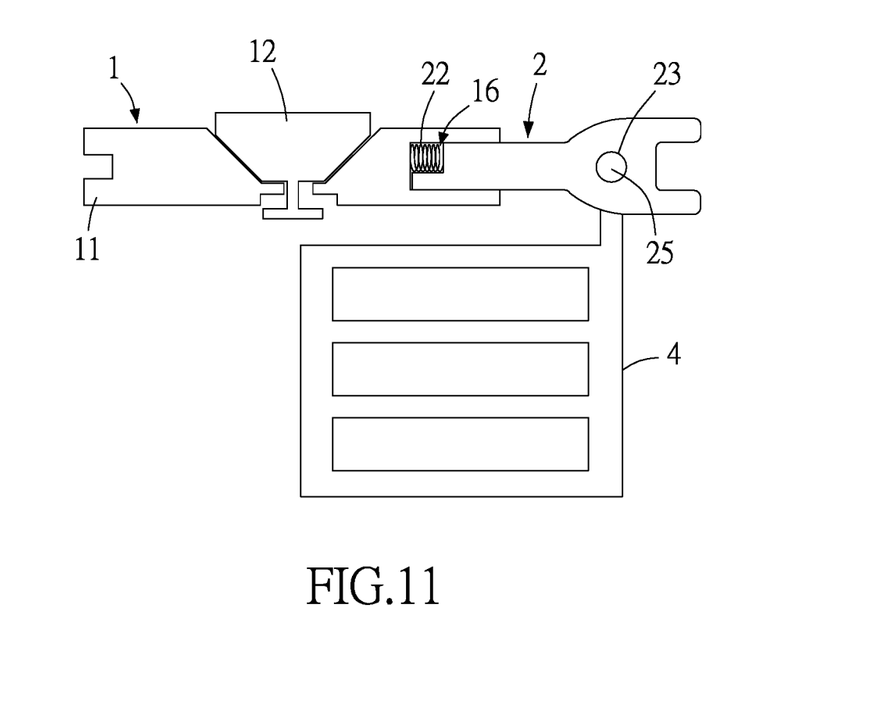
FIG. 11 is a schematic view of the fastening structure according to the ninth preferred embodiment of the present disclosure.

Referring to FIG. 11, in this embodiment, the second object 4 is a frame (or a box or a casing). The connecting portion 23 of the body portion 2 is movably coupled to the second object 4 by the pivot 25. The operating engaging element 1 has the mounting portion 16 which the body portion 2 is mounted on. The mounting portion 16 has therein the first resilient component 22. The operating portion 12 dispenses with the second resilient component, and thus the operating portion 12 is manipulated under the resilient restoring force of the first resilient component 22. In this embodiment, the engaging portion 11 of the operating engaging element 1 is of a concave structure (a convex structure) to render the fastening structure of the present disclosure practical.

Figure 12:
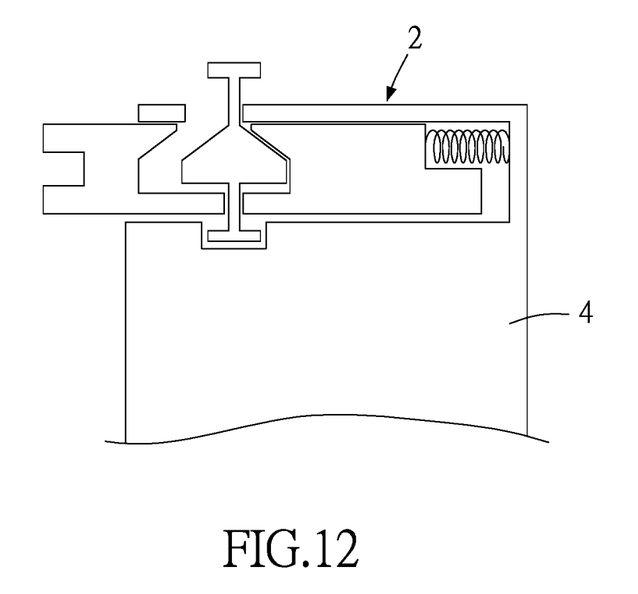
FIG. 12 is a schematic view of the fastening structure according to the tenth preferred embodiment of the present disclosure.

Referring to FIG. 12, in this embodiment, the body portion 2 and the second object 4 are integrally formed to thereby meet various needs for fastening objects together.

Figure 13:
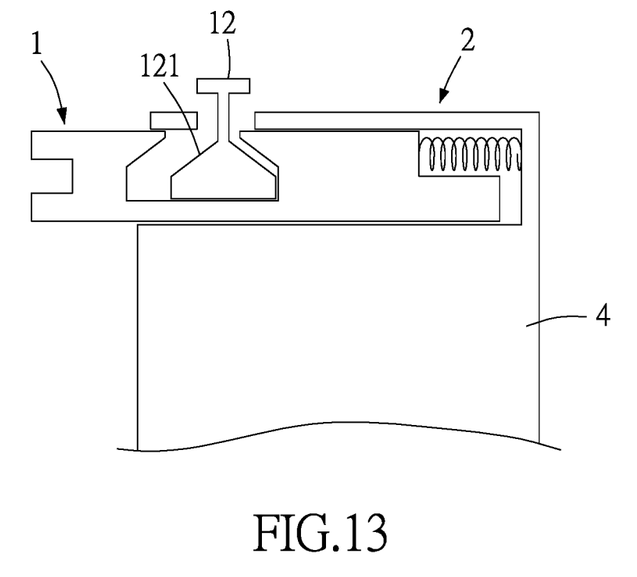
FIG. 13 is a schematic view of the fastening structure according to the eleventh preferred embodiment of the present disclosure.
Figure 14:
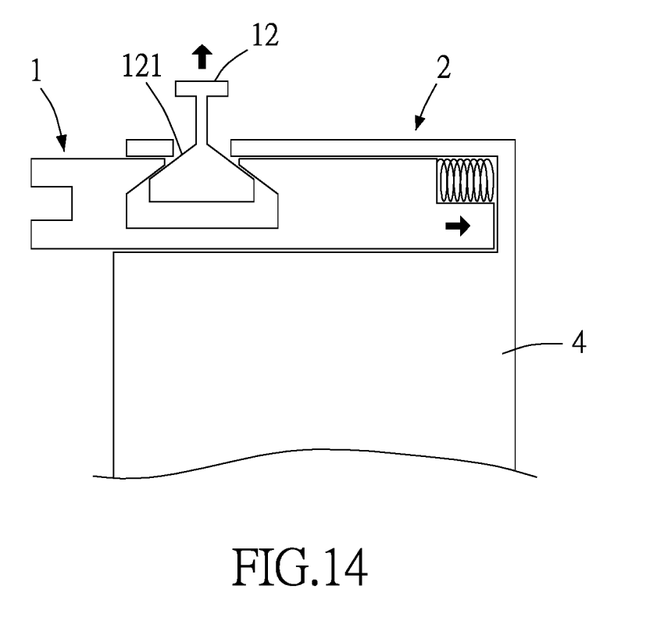
FIG. 14 is a schematic view of operation of the fastening structure according to the eleventh preferred embodiment of the present disclosure.

Referring to FIG. 13 and FIG. 14, in this embodiment, the body portion 2 and the second object 4 are integrally formed, whereas the stop portion 121 of the operating portion 12 is movably stopped at the operating engaging element 1 to prevent separation of the operating portion 12 from the operating engaging element 1. In the fastened state shown in FIG. 13, to effectuate separation, the user pulls the operating portion 12 upward such that the operating engaging element 1 can move within the body portion 2 to thereby effectuate separation shown in FIG. 14, so as to meet various needs for fastening objects together.

Figure 15:
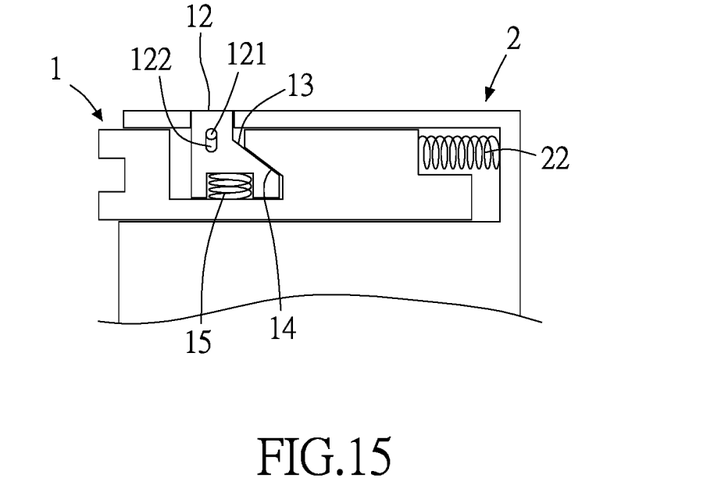
FIG. 15 is a schematic view of the fastening structure according to the twelfth preferred embodiment of the present disclosure.
Figure 16:
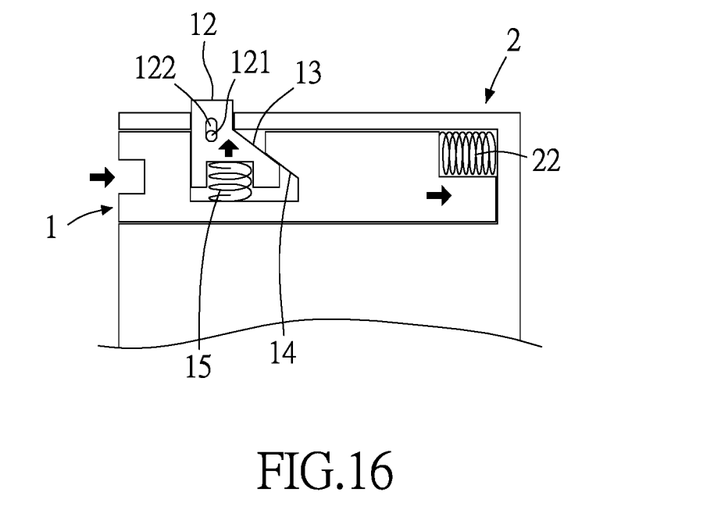
FIG. 16 is a schematic view of operation of the fastening structure according to the twelfth preferred embodiment of the present disclosure.

Referring to FIG. 15 and FIG. 16, in this embodiment, the operating portion 12 has a movable portion 122 movable by the stop portion 121. To operate the fastening structure, the user presses the operating portion 12 downward to allow the stop portion 121 to move within the movable portion 122 and compress the second resilient component 15, thereby allowing the moving surface 13 to abut against the corresponding moving surface 14, and allowing the operating portion 12 to move the operating engaging element 1 and compress the first resilient component 22. The movable portion 122 is disposed on the operating engaging element 1 or the body portion 2 as needed.

Figure 17:
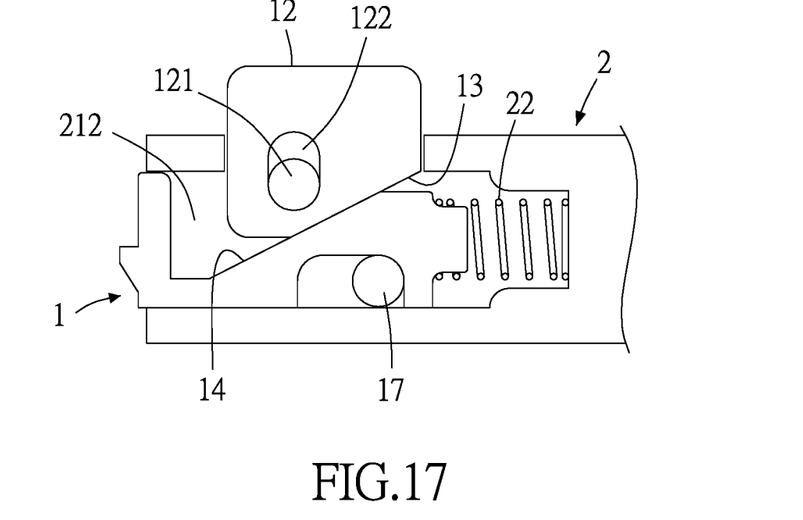
FIG. 17 is a schematic view of the fastening structure according to the thirteenth preferred embodiment of the present disclosure.
Figure 18:
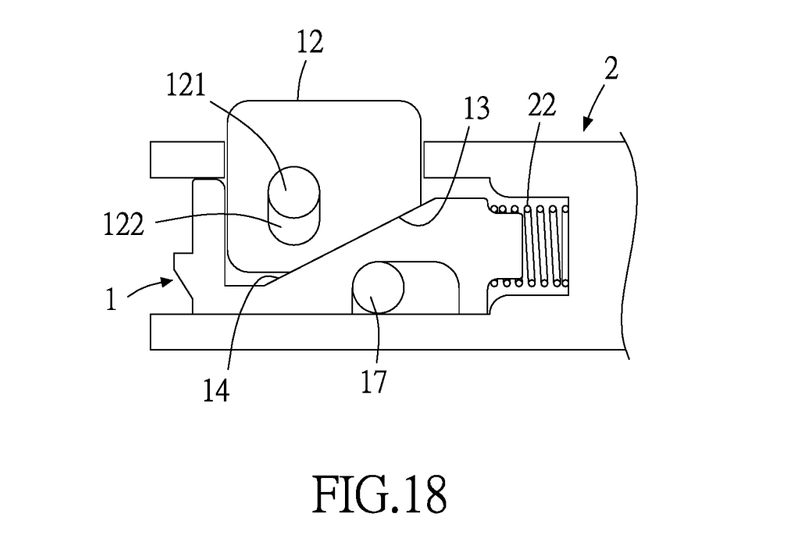
FIG. 18 is a schematic view of operation of the fastening structure according to the thirteenth preferred embodiment of the present disclosure.

Referring to FIG. 17 and FIG. 18, in this embodiment, the operating portion 12 has a movable portion 122 movable by the stop portion 121, whereas the second resilient component is not disposed between the operating portion 12 and the operating engaging element 1. To operate the fastening structure, the user presses the operating portion 12 downward such that the operating portion 12 moves, in the presence of the stop portion 121 and the movable portion 122, to the second moving space 212, allowing the moving surface 13 to abut against the corresponding moving surface 14; hence, the operating engaging element 1 moves relative to the connector 17 and compress the first resilient component 22, allowing the operating portion 12 to move the operating engaging element 1 within the body portion 2.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent modifications and replacements made to the aforesaid embodiments shall fall within the scope of the present disclosure. Accordingly, the legal protection for the present disclosure shall be defined by the appended claims.

What is claimed is:

1. A fastening structure, comprising:
   an operating portion having a moving surface;
   an operating engaging element having an engaging portion, the moving surface abutting against a corresponding moving surface of the operating engaging element to cause the operating engaging element to undergo displacement;
   a body portion having a mounting portion which the operating engaging element is mounted on, or the operating engaging element having a mounting portion which the body portion is mounted on;
   a first resilient component with an end abutting against the body portion and another end abutting against the operating engaging element; and
   a second resilient component with an end abutting against the operating portion and another end abutting against the operating engaging element.

2. The fastening structure of claim 1, wherein a first moving space is disposed between the operating portion and the body portion.

3. The fastening structure of claim 1, wherein the operating portion has a stop portion, and the stop portion is stopped at the operating engaging element, or the body portion.

4. The fastening structure of claim 1, wherein the body portion has a connecting portion, and the connecting portion is configured to be connected to an object.

5. The fastening structure of claim 4, wherein the connecting portion is movably connected to a pivot, and the pivot is configured to be connected to the object.

6. The fastening structure of claim 5, wherein an axial portion is movably coupled to the pivot.

7. The fastening structure of claim 1, wherein the body portion has a push portion for pushing and moving an object.

8. The fastening structure of claim 1, wherein, when the moving surface abuts against the corresponding moving surface, the operating engaging element is driven by the operating portion to move toward the body portion such that a receiving space of the mounting portion gradually diminishes because of movement of the operating engaging element.

* * * * *